United States Patent
Hirai

(10) Patent No.: US 10,414,160 B2
(45) Date of Patent: Sep. 17, 2019

(54) COMPOSITE SUBSTRATE INCLUDING FIRST SUBSTRATE HAVING FIRST SURFACE, SECOND SUBSTRATE HAVING SECOND SURFACE FACING FIRST SURFACE, AND FIRST AND SECOND BUMPS PROVIDED AT FIRST SURFACE

(71) Applicant: BROTHER KOGYO KABUSHIKI KAISHA, Nagoya-shi, Aichi-ken (JP)

(72) Inventor: Keita Hirai, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/988,381

(22) Filed: May 24, 2018

(65) Prior Publication Data

US 2019/0100009 A1   Apr. 4, 2019

(30) Foreign Application Priority Data

Sep. 29, 2017   (JP) .................. 2017-192152

(51) Int. Cl.
B41J 2/14 (2006.01)

(52) U.S. Cl.
CPC ....... *B41J 2/14233* (2013.01); *B41J 2/14072* (2013.01); *B41J 2002/14241* (2013.01); *B41J 2002/14491* (2013.01); *B41J 2202/18* (2013.01)

(58) Field of Classification Search
CPC ................ B41J 2/14233; B41J 2/14072; B41J 2202/18; B41J 2002/14491; B41J 2002/14241
See application file for complete search history.

(56) References Cited

U.S. PATENT DOCUMENTS

| 2007/0052764 A1* | 3/2007 | Oku .................. B41J 2/161 347/68 |
| 2016/0257093 A1* | 9/2016 | Yoshiike .............. B32B 7/12 |
| 2017/0066241 A1 | 3/2017 | Naganuma et al. |
| 2017/0313074 A1* | 11/2017 | Saimen .............. B41J 2/14233 |

FOREIGN PATENT DOCUMENTS

| JP | 2009-296002 A | 12/2009 |
| JP | 2014-51008 A | 3/2014 |
| JP | 2017-52135 A | 3/2017 |

* cited by examiner

Primary Examiner — Geoffrey S Mruk
(74) Attorney, Agent, or Firm — Merchant & Gould P.C.

(57) ABSTRACT

A composite substrate includes: a first substrate; a second substrate; an electric contact; a first bump; and a second bump. The first substrate has a first surface. The first substrate has a thickness defining a thickness direction. The second substrate has a second surface. The second surface faces the first surface with a predetermined gap therebetween in the thickness direction. The electric contact is positioned at the second surface. The first bump includes: a core; and a conducting film. The core is provided at the first surface and has a convex shape protruding in the thickness direction. The conducting film covers a part of the core and is in contact with the electric contact. The second bump is provided at the first surface and has a convex shape protruding in the thickness direction. The second bump has a dimension in the thickness direction smaller than that of the first bump.

20 Claims, 13 Drawing Sheets

COMPOSITE SUBSTRATE INCLUDING FIRST SUBSTRATE HAVING FIRST SURFACE, SECOND SUBSTRATE HAVING SECOND SURFACE FACING FIRST SURFACE, AND FIRST AND SECOND BUMPS PROVIDED AT FIRST SURFACE

CROSS REFERENCE TO RELATED APPLICATION

This application claims priority from Japanese Patent Application No. 2017-192152 filed Sep. 29, 2017. The entire content of the priority application is incorporated herein by reference.

TECHNICAL FIELD

The present disclosure relates to a composite substrate such as an inkjet head.

BACKGROUND

Conventionally, a composite substrate configured by bonding a plurality of substrates together has been used in inkjet heads and the like. In this type of composite substrate, protrusion-like bump parts are disposed between the bottom surface of the first substrate and the top surface of the second substrate, and the two substrates are bonded together through the bump parts.

The bump parts described above include two types of bump parts having substantially the same shape, and specifically a first bump part and a second bump part. The first bump part has bumps for forming electrically conductive connections. The first bump part is disposed so as to contact electrical contacts provided on the top surface of the second substrate to form electrical connections between the first substrate and second substrate. The second bump part is configured of an insulating material and is arranged in a position separated from the electrical contacts.

SUMMARY

However, when the first substrate is stacked on top of the second substrate and bonded thereto in the conventional composite substrate described above, a load is applied to the second substrate through the bump parts. This load has the potential to cause the second substrate to bend, deform, or break.

In view of the foregoing, it is an object of the present disclosure to provide a composite substrate capable of suppressing the occurrence of bending, deformation, or breakage in the second substrate due to the load applied during bonding.

In order to attain the above and other objects, the present disclosure provides a composite substrate that includes: a first substrate; a second substrate; an electric contact; a first bump; and a second bump. The first substrate has a first surface. The first substrate has a thickness defining a thickness direction. The second substrate has a second surface. The second surface faces the first surface with a predetermined gap therebetween in the thickness direction. The electric contact is positioned at the second surface. The first bump includes: a core; and a conducting film. The core is provided at the first surface and has a convex shape protruding in the thickness direction. The conducting film covers a part of the core and is in contact with the electric contact. The second bump is provided at the first surface and has a convex shape protruding in the thickness direction. The second bump has a dimension in the thickness direction smaller than that of the first bump.

BRIEF DESCRIPTION OF THE DRAWINGS

The particular features and advantages of the disclosure as well as other objects will become apparent from the following description taken in connection with the accompanying drawings, in which.

DETAILED DESCRIPTION

Figure 1:
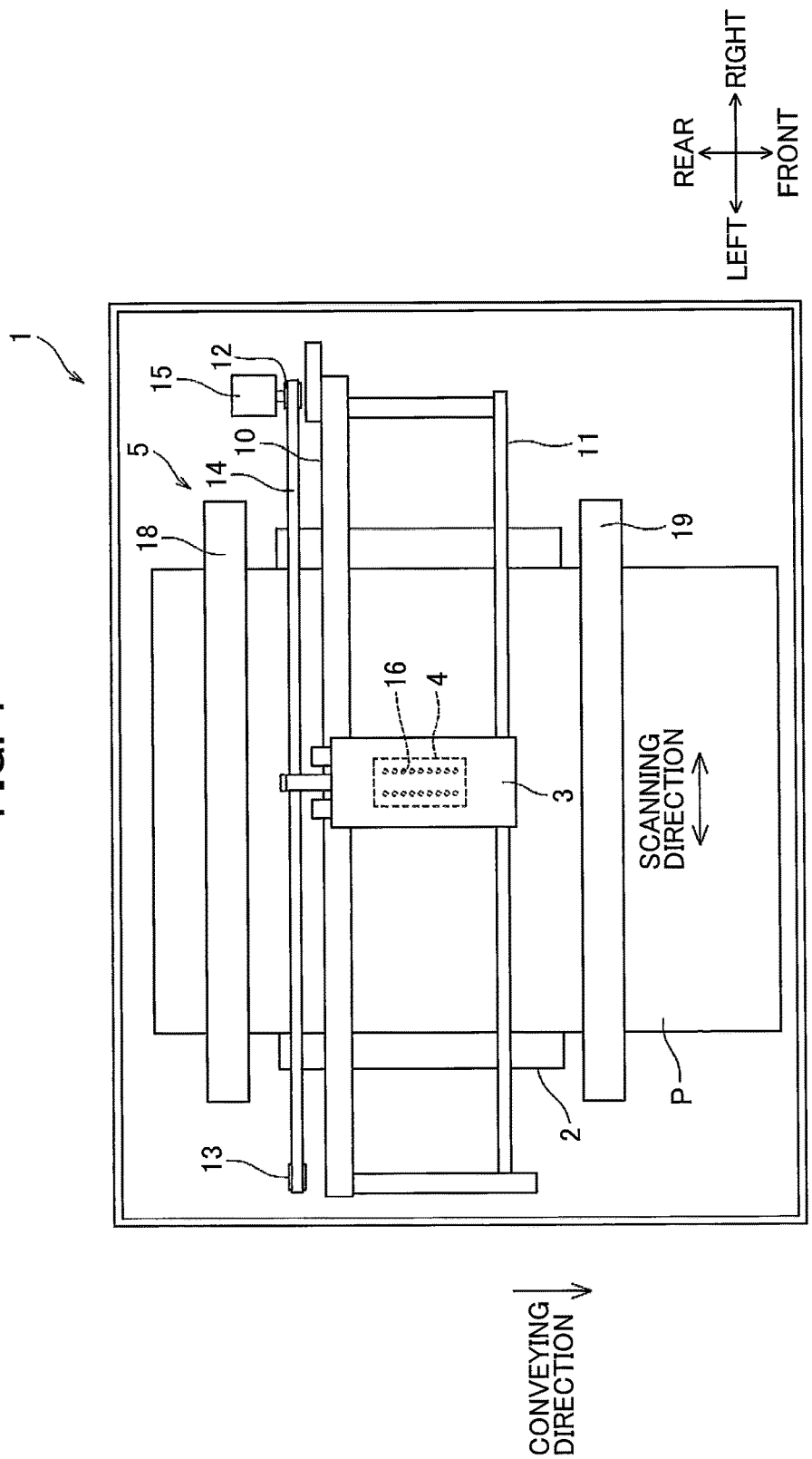
FIG. 1 is a schematic plan view illustrating an inkjet printer provided with an inkjet head according to an embodiment of the present disclosure.

Next, an embodiment of the present disclosure will be described while referring to the accompanying drawings wherein like parts and components are designated by the same reference numerals to avoid duplicating description. The embodiment described below covers a case in which a composite substrate according to the present disclosure is applied to an inkjet head.

FIG. 1 is a schematic plan view illustrating an inkjet printer 1 provided with an inkjet head 4 (an example of the composite substrate) according to the embodiment of the present disclosure. In the following description, the direction from the far side of FIG. 1 toward the near side will be defined as the upward direction, and the opposite direction thereto will be defined as the downward direction. The direction from the right side of FIG. 1 toward the left side will be defined as the leftward direction, and the opposite direction thereto will be defined as the rightward direction. The direction from the top of FIG. 1 toward the bottom will be defined as the forward direction, and the opposite direction thereto will be defined as the rearward direction. Further, terminology related to directions, such as up, down, left, right, front, and rear, will be used in the following description.

As illustrated in FIG. 1, the inkjet printer 1 includes a platen 2, a carriage 3, the inkjet head 4, and a conveying mechanism 5.

A recording sheet P rests the top surface of the platen 2. The recording sheet P is a recording medium. Two guide rails 10 and 11 are provided above the platen 11. The guide rails 10 and 11 extend parallel to a scanning direction (the left-right direction in the present embodiment). The carriage 3 is capable of reciprocating in the scanning direction along the guide rails 10 and 11 through a region opposing the platen 2. The carriage 3 is coupled to an endless belt 14. The endless belt 14 is looped around two pulleys 12 and 13. A carriage motor 15 drives the endless belt 14 to circulate about the pulleys 12 and 13. When the endless belt 14 is driven to circulate, the carriage 3 moves along the scanning direction.

The inkjet head 4 is mounted in the carriage 3 and moves along with the carriage 3 in the scanning direction. An ink cartridge (not illustrated) mounted in the inkjet printer 1 is connected to the inkjet head 4 by a tube. A plurality of nozzles 16 is formed in the bottom surface (the surface on the far side of FIG. 1) of the inkjet head 4. The inkjet head 4 ejects ink supplied from the ink cartridge through the nozzles 16 and onto the recording sheet P placed on the platen 2.

The conveying mechanism 13 has two conveying rollers 18 and 19 disposed on opposite sides of the platen 2 in the front-rear direction. A motor (not illustrated) drives the conveying rollers 18 and 19 to rotate. The conveying rollers 18 and 19 of the conveying mechanism 5 convey the recording sheet P on the platen 2 in a conveying direction (the forward direction in the present embodiment).

The inkjet printer 1 ejects ink from the inkjet head 4 toward the recording sheet P placed on the platen 2 while reciprocating the inkjet head 4 along with the carriage 3 in the scanning direction. In parallel to this operation, the conveying rollers 18 and 19 convey the recording sheet P in the conveying direction. Through these operations, images, text, and the like are recorded on the recording sheet P.

<Inkjet Head>

Figure 2:
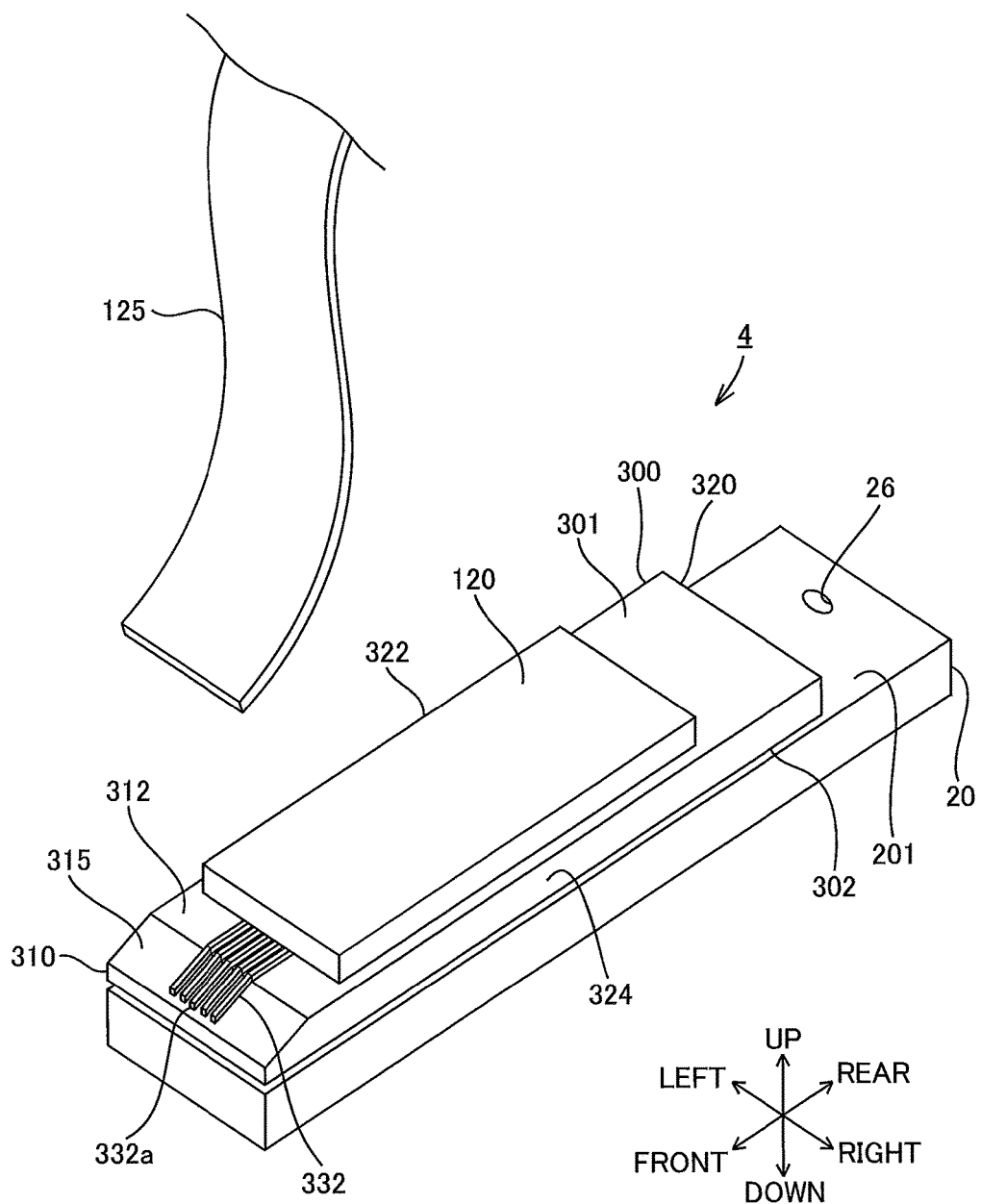
FIG. 2 is a perspective view of the inkjet head according to the embodiment of the present disclosure.
Figure 3:
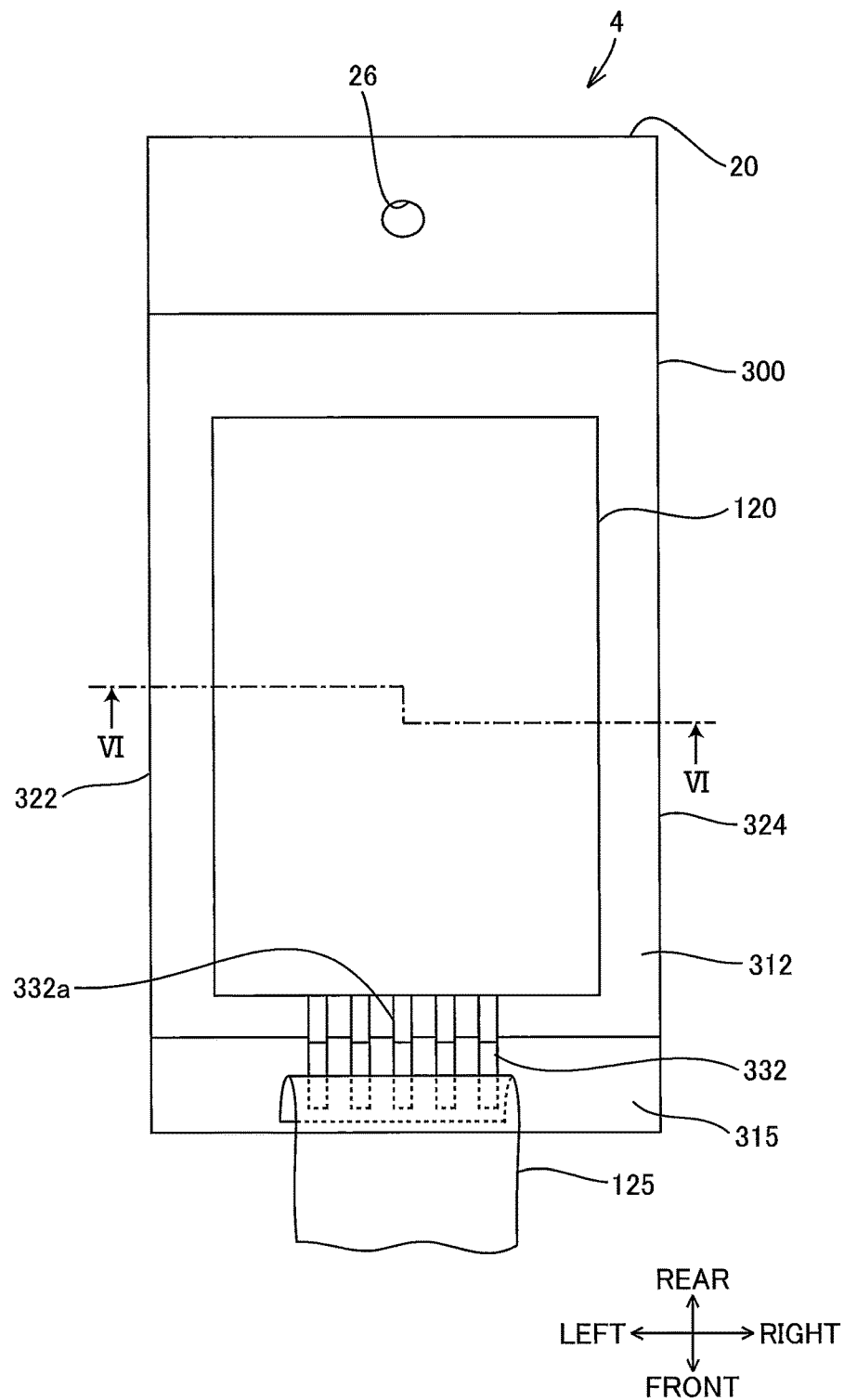
FIG. 3 is a plan view of the inkjet head according to the embodiment of the present disclosure.
Figure 4:
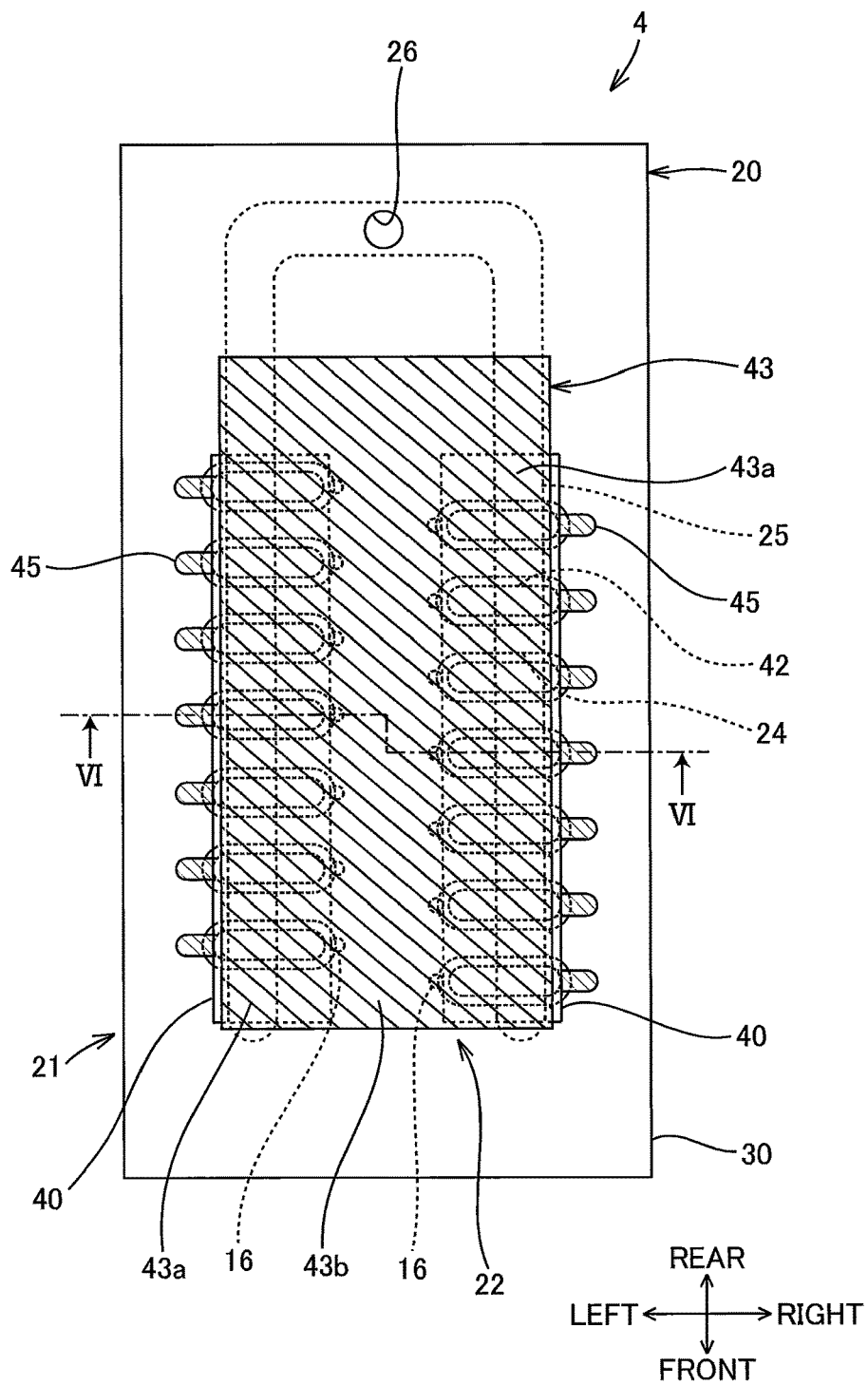
FIG. 4 is a plan view of the inkjet head (to which a drive interconnection substrate is not bonded) according to the embodiment of the present disclosure.
Figure 5:
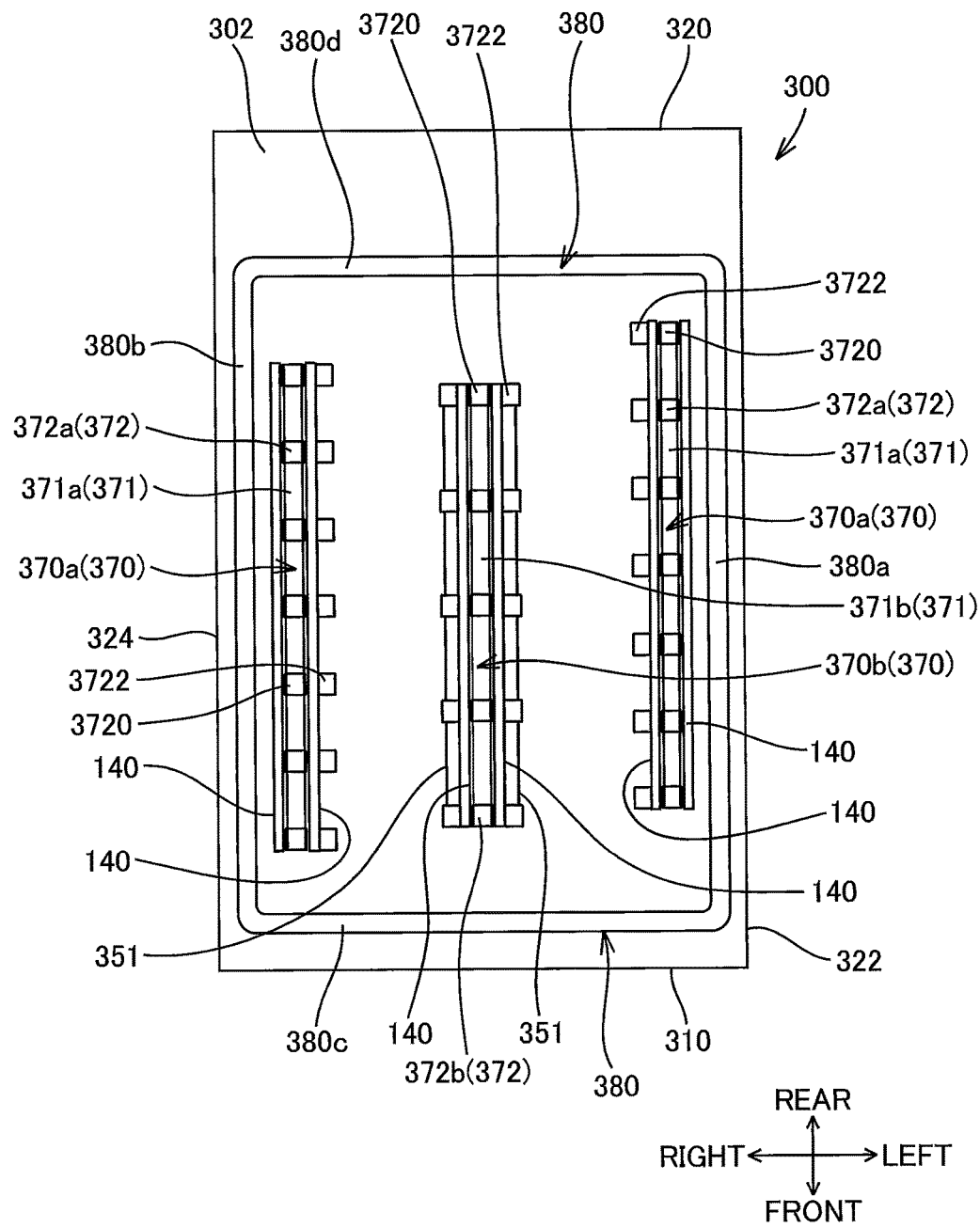
FIG. 5 is a bottom view of the drive interconnection substrate.
Figure 6:
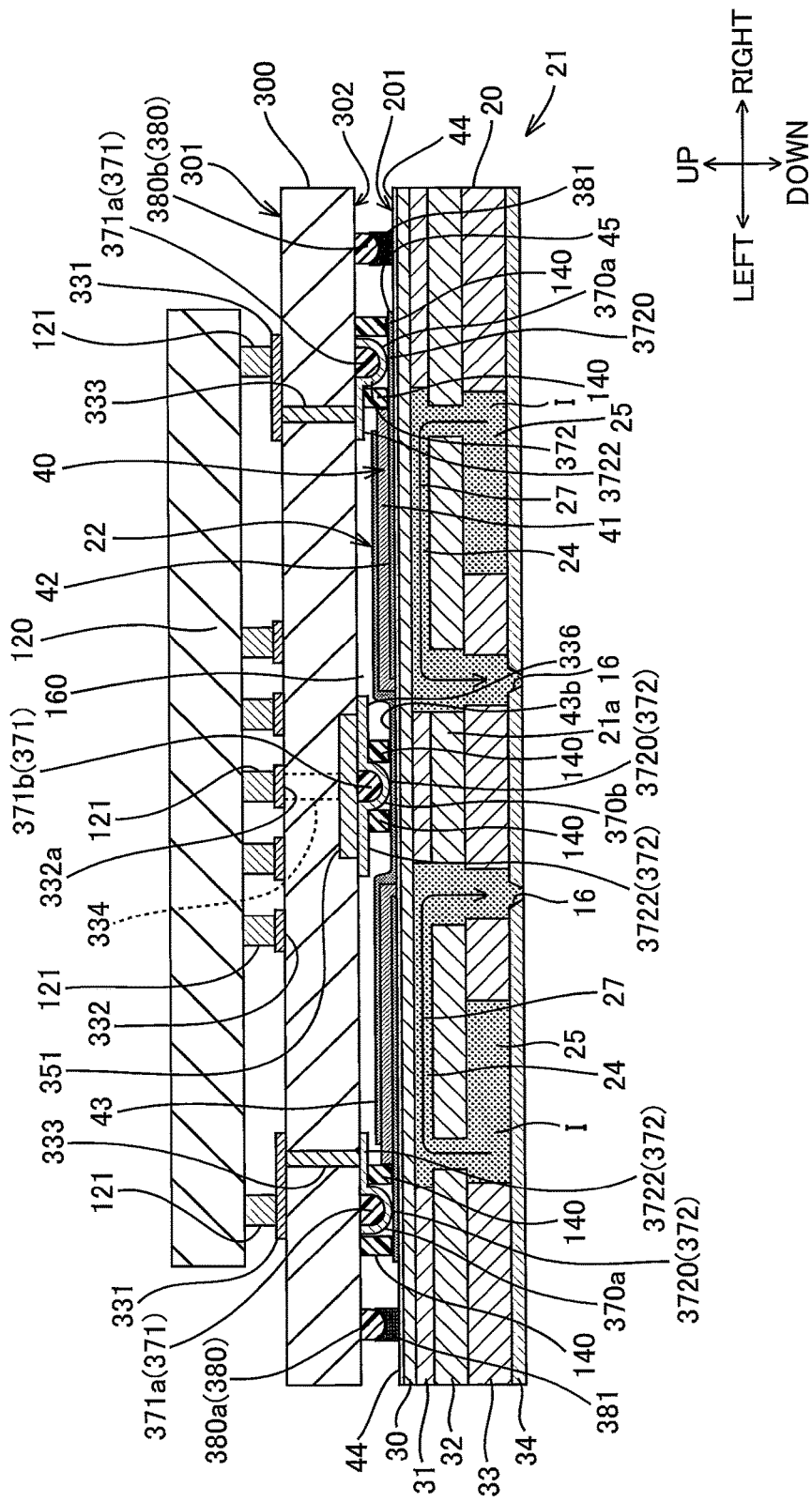
FIG. 6 is a cross-sectional view of the inkjet head taken along a line VI-VI in FIG. 3.

Next, the inkjet head 4 will be described in detail. FIGS. 2 and 3 are a perspective view and a plan view, respectively, of the inkjet head 4. FIG. 4 is a plan view of the inkjet head 4 without a drive interconnection substrate 300 (described later) illustrated in FIG. 2. FIG. 5 is a bottom view of the drive interconnection substrate 300. FIG. 6 is a cross-sectional view of the inkjet head 4 taken along the line VI-VI illustrated in FIG. 3. The line VI-VI is also illustrated in FIG. 4. Note that the letter "I" in FIG. 6 denotes ink accommodated in ink channels.

As illustrated in FIG. 2, the inkjet head 4 includes a channel forming substrate 20, and the drive interconnection substrate 300. The drive interconnection substrate 300 is an example of the first substrate, and the channel forming substrate 20 is an example of the second substrate.

As illustrated in FIG. 2, the channel forming substrate 2 has a general parallelepiped shape that is elongated in the front-rear direction. As illustrated in FIG. 6, the channel forming substrate 20 includes a channel unit 21 (a channel structure) and a piezoelectric actuator 22 disposed on the top surface of the channel unit 21.

<Channel Unit>

As illustrated in FIG. 6, the channel unit 21 has a layered structure comprising five plates 30-34, namely, a nozzle plate 34, a first plate 33, a second plate 32, a third plate 31, and a vibration plate 30, which are stacked in this order from bottom to top. Each of the plates 30-34 is formed with a plurality of channel forming holes. When the plates 30-34 are stacked together, the channel forming holes communicate with each other to thereby form ink channels, as well be described below. Although not particularly limited to any material, the five plates 30-34 may be configured of metal plates formed of stainless steel or nickel alloy steel, for example. In the present embodiment, the plates 30-34 are single-crystal silicon substrates.

As illustrated in FIG. 4, an ink supply hole 26 is formed in the top surface of the channel unit 21. The ink supply hole 26 is connected to the ink cartridge (not illustrated). Two manifolds 25 are formed inside the channel unit 21. The manifolds 25 are elongated in the front-rear direction. Both manifolds 25 are connected to and share the single ink supply hole 26. Ink in the ink cartridge is supplied into the manifolds 25 through the ink supply hole 26.

As illustrated in FIGS. 4 and 6, the channel unit 21 has a plurality of nozzles 16, and a plurality of pressure chamber 24. The nozzles 16 are formed in the nozzle plate 34, which is the bottommost layer of the channel unit 21, and are open in the bottom surface of the channel unit 21. The pressure chambers 24 are provided in correspondence with the nozzles 16 on a one-to-one basis, and each of the pressure chambers 24 is in communication with the corresponding nozzles 16.

As illustrated in FIG. 4, the nozzles 16 are arranged in the bottom surface of the channel unit 21 (the bottom surface of the nozzle plate 34, i.e., the surface facing the far side of the drawing in FIG. 4) in two rows extending in the front-rear direction. Note that the nozzles 16 in the two nozzle rows are arranged so as to be staggered relative to each other in the front-rear direction, i.e., so that the positions of the nozzles 16 in one row are offset in the front-rear direction from the positions of the nozzles 16 in the other row.

In a plan view illustrated in FIG. 4, each of the pressure chambers 24 has a general elliptical shape that is elongated in the left-right direction. The pressure chambers 24 are arranged along the same plane. The vibration plate 30 covers the tops of the pressure chambers 24. The pressure chambers 24 are also arranged in two rows that are staggered relative to each other along the front-rear direction to correspond with the positions of the nozzles 16. Each pressure chamber 24 is in communication with the corresponding nozzle 16 at one longitudinal end of the pressure chamber 24. The positional relationships of the pressure chambers 24 and nozzles 16 are reversed between the left and right pressure chamber rows. That is, the nozzles 16 communicate with the right longitudinal ends of the corresponding pressure chambers 24 in the left pressure chamber row, while the nozzles 16 communicate with the left longitudinal ends of the corresponding pressure chambers 24 in the right pressure chamber row. With this arrangement, two nozzle rows are formed along the insides of the corresponding pressure chamber rows, as illustrated in FIG. 4.

The pressure chamber rows are arranged in positions that overlap the corresponding manifolds 25. Each pressure chamber 24 is in communication with the manifold 25 positioned directly beneath the pressure chamber 24. With this configuration, a plurality of individual ink channels 27 is formed in the channel unit 21. Each individual ink channel 27 branches off from the corresponding manifold 25 and passes through the corresponding pressure chamber 24 to arrive at the corresponding nozzle 16.

<Piezoelectric Actuator>

Next, the piezoelectric actuator 22 will be described in detail. The piezoelectric actuator 22 is disposed on the top surface of the vibration plate 30 constituting the channel unit 21. As illustrated in FIGS. 4 and 6, the piezoelectric actuator 22 has two piezoelectric materials 40, a plurality of individual electrodes 42, and a common electrode 43. The individual electrodes 42 and common electrode 43 are examples of the electric contact.

As illustrated in FIG. 6, an insulating layer 44 formed of an insulating material, such as a synthetic resin material, is formed over substantially the entire top surface of the vibration plate 30. The two piezoelectric materials 40 are disposed on the top surface of the vibration plate 30 covered by the insulating layer 44. Each of the piezoelectric materials 40 is formed in a rectangular shape elongated in the front-rear direction in a plan view. The piezoelectric materials 40 are oriented with their longitudinal dimensions aligned with the rows of pressure chambers 24 and cover the corresponding pressure chamber rows. The piezoelectric materials 40 are formed of a material whose primary component is lead zirconate titanate (PZT). PZT is a ferroelectric solid solution of lead titanate and lead zirconate. Note that the piezoelectric materials 40 may also be formed directly on the top surface of the vibration plate 30 covered by the insulating layer 44 through a well-known film formation technique, such as a sputtering method or a sol-gel method. Alternatively, the piezoelectric materials 40 may be formed by pasting a thin green sheet to the vibration plate 30 after the green sheet has been sintered.

The individual electrodes 42 are provided in correspondence with the pressure chambers 24 on a one-to-one basis, and are formed in regions on the bottom surfaces of the piezoelectric materials 40 that correspond to the pressure chambers 24. In a plan view illustrated in FIG. 4, each individual electrode 42 has a general elliptical shape that is slightly smaller than the pressure chambers 24 and is arranged so as to confront the approximate center region of the corresponding pressure chamber 24. The individual electrodes 42 are electrically insulated from the vibration plate 30 by the insulating layer 44.

Individual drive terminals 45 are respectively connected to corresponding individual electrodes 42. Each of the individual drive terminals 45 is led over the insulating layer 44 from the corresponding individual electrode 42 toward the side opposite the corresponding nozzle 16 in the longitudinal direction of the individual electrode 42 (toward the outer side of the piezoelectric material 40) to an area that does not oppose the pressure chamber 24. Thus, the individual drive terminals 45 are exposed on the outside of the piezoelectric materials 40, as illustrated in FIGS. 4 and 6. Hence, the individual drive terminals 45 are arranged in rows extending in the front-rear direction along the outer left-right sides of the piezoelectric materials 40. Individual drive bumps 370a described later are connected to corresponding individual drive terminals 45. Through the individual drive bumps 370a, a prescribed drive voltage is applied individually to the individual electrodes 42.

The common electrode 43 is formed across both piezoelectric materials 40 so as to cover substantially the entire top surfaces of the piezoelectric materials 40. In FIG. 4, the common electrode 43 covering the two piezoelectric materials 40 is depicted with hatching. Specifically, the common electrode 43 has two electrode parts 43a formed over the entire top surfaces of the respective piezoelectric materials 40, and a connecting part 43b formed in the region on the top surface of the vibration plate 30 between two piezoelectric materials 40.

The connecting part 43b is elongated in the front-rear direction, extending along the long sides of the two rectangular piezoelectric materials 40. The connecting part 43b is electrically insulated from the vibration plate 30 by the insulating layer 44. Further, since the connecting part 43b is formed on the top surface of the vibration plate 30, the vertical position of the connecting part 43b is lower than the two electrode parts 43a formed on the top surfaces of the piezoelectric materials 40. As illustrated in the cross-sectional view of FIG. 6, the common electrode 43 is shaped with a concave depression at the connecting part 43b. The connecting part 43b opposes a partitioning part 21a of the channel unit 21. The partitioning part 21a is a wall portion that partitions the two rows of pressure chambers 24. Hence, the connecting part 43b is disposed in a region on the top surface of the vibration plate 30 that does not oppose pressure chambers 24. The connecting part 43b is connected to a common drive bump 370b described later and maintained at a bias potential (the ground potential in the present embodiment).

As illustrated in FIG. 6, the portions of the piezoelectric materials 40 interposed between each of the individual electrodes 42 and the common electrode 43 (hereinafter called "piezoelectric elements 41") are the portions that deform when drive voltages are applied to the corresponding individual electrodes 42 and apply ejection energy to ink inside the corresponding pressure chambers 24, as will be described below. By arranging a single piezoelectric material 40 across the plurality of pressure chambers 24 belonging to one row of pressure chambers 24 (pressure chamber row) in the present embodiment, the piezoelectric elements 41 corresponding to this pressure chamber row are integrally configured. In addition, each of the piezoelectric elements 41 is polarized in the thickness direction thereof. The piezoelectric elements 41 are examples of the actuator element.

When a drive voltage is applied to one of the individual electrodes 42, an electric potential difference is produced between the individual electrode 42 and the common electrode 43 which is maintained at the ground potential. Consequently, an electric field along the thickness direction is applied to the portion of the piezoelectric material 40 between the individual electrode 42 and common electrode 43 (i.e., the piezoelectric element 41). Since the direction of this electric field is parallel to the direction of polarization in the piezoelectric element 41, the piezoelectric element 41 expands in its thickness direction and contracts along its planar direction. This expansion and contraction of the piezoelectric element 41 force the vibration plate 30 that covers the pressure chamber 24 to warp into a convex shape toward the pressure chamber 24 side, thereby decreasing the capacity of the pressure chamber 24. As a result, pressure (ejection energy) is applied to the ink in the pressure chamber 24, so that an ink droplet is ejected from the corresponding nozzle 16.

<Drive Interconnection Substrate>

As illustrated in FIG. 2, the drive interconnection substrate 300 has a general rectangular parallelepiped shape that is elongated in the front-rear direction, similar to the channel forming substrate 20. The drive interconnection substrate 300 has a top surface 301 and a bottom surface 302 and includes a front end 310, a rear end 320, a left side 322, and a right side 324. As illustrated in FIGS. 2 and 6, the drive interconnection substrate 300 is arranged relative to the channel forming substrate 20 such that the bottom surface 302 of the drive interconnection substrate 300 opposes but is separated from the top surface 201 of the channel forming substrate 20 (the surface on the piezoelectric actuator 22 side). The drive interconnection substrate 300 is bonded to the channel forming substrate 20. The drive interconnection substrate 300 is formed of the same material as the channel forming substrate 30, i.e., a single-crystal silicon substrate in the present embodiment. The drive interconnection substrate 300 has approximately the same width in the left-right direction as the channel forming substrate 20. The bottom surface 302 of the drive interconnection substrate 300 is an example of the first surface. The top surface 201 of the channel forming substrate 20 is an example of the second surface. The left side 322 and right side 324 of the drive interconnection substrate 300 are examples of the end of the first surface.

<Bottom Surface of Drive Interconnection Substrate>

As illustrated in FIG. 2, the bottom surface 302 of the drive interconnection substrate 300 has a rectangular shape in a bottom view. The drive interconnection substrate 300 is arranged so as to oppose the top surface of the vibration plate 30 constituting the channel unit 21, with the left side 322 and right side 324 (i.e., the long sides of the drive interconnection substrate 300) aligned with the rows of pressure chamber 24, and is bonded to the vibration plate 30 so as to cover the tops of the two piezoelectric materials 40.

As described above, the individual drive terminals 45 are arranged on the top surface of the vibration plate 30 and led out from the corresponding individual electrodes 42 to regions on both sides of the two piezoelectric materials 40 with respect to the left-right direction.

In other words, pluralities of individual drive terminals 45 are formed on the top surface of the vibration plate 30 on the left-right outer sides of the two piezoelectric materials 40. In addition, the connecting part 43b of the common electrode 43 described above is arranged on the top surface of the vibration plate 30 in the region between the two piezoelectric materials 40.

An embedded interconnect 351 is formed in the bottom surface 302 of the drive interconnection substrate 300 that opposes the vibration plate 30. A plurality of bumps 370 and a plurality of pairs of spacers 140 are also provided on the bottom surface 302 that confronts the vibration plate 30 and protrude downward therefrom.

<Embedded Interconnect>

At least a portion of the embedded interconnect 351 is embedded in the drive interconnection substrate 300. In the present embodiment, the entire embedded interconnect 351 is embedded in the bottom surface 302 of the drive interconnection substrate 300. As illustrated in FIG. 5, the embedded interconnect 351 extends along the front-rear direction (in a direction parallel to the nozzle rows of the nozzles 16). With this arrangement, the surface of the embedded interconnect 351 on the bottom surface 302 side is exposed in the bottom surface 302 of the drive interconnection substrate 300. The exposed surface of the embedded interconnect 351 is approximately flush with the bottom surface 302 of the drive interconnection substrate 300.

<Drive Bumps>

As illustrated in FIG. 5, two individual drive bumps 370a for forming connections with the individual drive terminals 45 are provided on the bottom surface 302 of the drive interconnection substrate 300. The individual drive bumps 370a are arranged along the left side 322 and the right side 324 of the rectangular drive interconnection substrate 300. Further, a common drive bump 370b for forming connections with the connecting part 43b of the common electrode 43 is provided on the embedded interconnect 351 in the center region on the bottom surface 302 of the drive interconnection substrate 300. In the following description, the individual drive bumps 370a and common drive bump 370b will be collectively called "drive bumps 370." The drive bumps 370 are examples of the first bump.

Each of the drive bumps 370 has a core part 371, and a plurality of conducting films 372. The core part 371 is formed of an insulating material, and preferably an elastic resin material. Before the drive interconnection substrate 300 is connected to the channel forming substrate 20, the core part 371 has a columnar shape. A cross-section of the core part 371 taken orthogonal to its longitudinal direction is substantially semicircular or semielliptical. The core part 371 is disposed on the bottom surface 302 of the drive interconnection substrate 300 so that its longitudinal direction is parallel to the front-rear direction and its curved surface faces the top surface 201 of the channel forming substrate 20. The core part 371 is an example of the core of the firsts bump, and the plurality of conducting films 372 is examples of the conducting film of the first bump.

Each conducting film 372 includes a cover part 3720 that covers at least part of the curved surface of the core part 371, and one or two extension parts 3722 that extend from one or both ends of the cover part 3720 over the bottom surface 302 of the drive interconnection substrate 300 or the embedded interconnect 351. In the present embodiment, the core parts 371 of all drive bumps 370 are formed of the same material. The cover part 3720 and the core part 371 covered by the cover part 3720 are examples of the connection bump. In other words, a plurality of connection bumps arranged on the bottom surface 302 of the drive interconnection substrate 300 in two rows extending in the front-rear direction. The front-rear direction is an example of the second direction, and the left-right direction is an example of the first direction. The vertical direction (up-down direction) is an example of the thickness direction.

In the present embodiment, the core part 371 of the individual drive bump 370a (hereinafter called the "individual drive bump core part 371a") provided near the left side 322 extends in the front-rear direction along the edge of the left side 322. The conducting films 372 of this individual drive bump 370a (hereinafter called the "individual drive bump conducting films 372a") are arranged in the front-rear direction at positions corresponding one-on-one with the individual drive terminals 45 in the row on the left side of the channel forming substrate 20. In other words, the individual drive bump conducting films 372a in the left individual drive bump 370a are arranged in the front-rear direction at the same pitch as the corresponding individual drive terminals 45. For each individual drive bump conducting film 372a in the left individual drive bump 370a, the cover part 3720 covers the individual drive bump core part 371a, while the extension part 3722 extends rightward from the cover part 3720.

In the individual drive bump 370a provided near the right side 324, the individual drive bump core part 371a extends in the front-rear direction along the edge of the right side 324. The individual drive bump conducting films 372a are juxtaposed in the front-rear direction at positions corresponding one-on-one to the individual drive terminals 45 in the row on the right side of the channel forming substrate 20. Hence, the individual drive bump conducting films 372a in the right individual drive bump 370a are also arranged in the front-rear direction at a pitch equivalent to the pitch of the corresponding individual drive terminals 45. For each individual drive bump conducting film 372a in the right individual drive bump 370a, the cover part 3720 covers the individual drive bump core part 371a, while the extension part 3722 extends leftward from the cover part 3720.

The core part 371 of the common drive bump 370b (hereinafter called the "common drive bump core part 371b") provided over the embedded interconnect 351 extends in the front-rear direction along the approximate left-right center region of the embedded interconnect 351. The conducting films 372 of the common drive bump 370b (hereinafter called the "common drive bump conducting films 372b") are juxtaposed in the front-rear direction. In each common drive bump conducting film 372b, the cover part 3720 covers the common drive bump core part 371b, and the extension parts 3722 extend in both left and right directions from the cover part 3720.

<Dummy Bumps>

As illustrated in FIG. 5, dummy bumps 380a, 380b, 380c, and 380d are also provided on the bottom surface 302 of the drive interconnection substrate 300. The dummy bump 380a extends in the front-rear direction along the left side 322 of the drive interconnection substrate 300 formed in a rectangular shape and is juxtaposed on the left side of the individual drive bump 370a closest to the left side 322 of the drive interconnection substrate 300. The dummy bump 380b extends in the front-rear direction along the right side 324 of the drive interconnection substrate 300 and is juxtaposed on the right side of the individual drive bump 370a closest to the right side 324 of the drive interconnection substrate 300. The dummy bump 380c extends in the left-right direction along the front end 310 of the drive interconnection substrate 300 so as to connect the front end of the dummy bump 380a to the front end of the dummy bump 380b. The dummy bump 380d extends in the left-right direction along the rear end 320 of the drive interconnection substrate 300 so as to connect the rear end of the dummy bump 380a to the rear end of the dummy bump 380b. Hence, the dummy bumps 380a, 380b, 380c, and 380d extend along the entire periphery of the rectangular drive interconnection substrate 300 so as to surround the two piezoelectric materials 40 (the plurality of piezoelectric elements 41) provided on the channel forming substrate 20. Since each of the dummy bumps 380a, 380b, 380c, and 380d has substantially the same shape, they will be collectively called dummy bumps 380. The dummy bumps 380 are examples of the second bump.

The dummy bumps 380 have the same vertical dimension as the core parts 371 of the drive bumps 370, i.e., the same dimension in the thickness direction of the drive interconnection substrate 300 in which the dummy bumps 380 protrude from the bottom surface 302 of the drive interconnection substrate 300. Therefore, the vertical dimensions of the dummy bumps 380 are smaller than the vertical dimensions of the drive bumps 370 covered by the cover parts 3720 of the conducting films 372.

The dummy bumps 380 are arranged in positions to prevent contact with any electrodes provided on the channel forming substrate 20. Specifically, the dummy bumps 380 are arranged in positions opposing the insulating layer 44 covering the vibration plate 30. The dummy bumps 380 are formed of the same material and in the same shape as the core parts 371 of the drive bumps 370. That is, the dummy bumps 380 have a columnar shape that extends in either the front-rear direction or the left-right direction and has a substantially semicircular or semielliptical cross section. The dummy bumps 380 are formed of a resin material that is an elastic insulating material. The dummy bumps 380 are disposed on the bottom surface 302 of the drive interconnection substrate 300 so that their curved surfaces face the channel forming substrate 20.

<Adhesive Layer>

As illustrated in FIG. 6, an adhesive layer 381 is provided between the dummy bumps 380 and the channel forming substrate 20. The adhesive layer 381 is formed of an insulating adhesive and is provided to fill the gaps between the curved surfaces of the dummy bumps 380 and the insulating layer 44. The adhesive layer 381 is formed by first applying adhesive over the entire curved surfaces of the dummy bumps 380 before bonding the drive interconnection substrate 300 to the channel forming substrate 20. The adhesive layer 381 fixes the positions of the dummy bumps 380 and drive interconnection substrate 300 relative to the channel forming substrate 20 and seals the gaps between the drive interconnection substrate 300 and channel forming substrate 20. The adhesive layer 381 is an example of the insulating layer and the adhesive agent layer.

<Spacers>

Pairs of spacers 140 extend in the front-rear direction along the core part 371 of each drive bump 370 so that each corresponding core part 371 is interposed between a pair of spacers 140 from both of the left and right sides. Here, the extension part 3722 of each individual drive bump conducting film 372a in the individual drive bumps 370a is vertically interposed between the bottom surface 302 of the drive interconnection substrate 300 and one of the spacers 140. The extension parts 3722 of the conducting films 372 in the common drive bump 370b are vertically interposed between the bottom surface 302 of the embedded interconnect 351 and corresponding spacers 140. The spacers 140 are formed of a photosensitive resin that is cured when exposed to light. An insulating material is used for the spacers 140 in the present embodiment, and is preferably a thermosetting resin that includes a photopolymerization initiator and whose primary component is an epoxy resin, acrylic resin, phenolic resin, polimide resin, silicone resin, or styrene resin. From the perspective of chemical resistance, the most preferable resin includes the epoxy resin as its primary component. Further, the vertical dimension of the spacers 140 is defined so as to maintain a prescribed gap between the drive interconnection substrate 300 and the channel forming substrate 20.

<Top Surface of Drive Interconnection Substrate>

As illustrated in FIG. 2, a driver IC 120 is disposed on the top surface 301 of the drive interconnection substrate 300. Additionally, as illustrated in FIG. 6, a plurality of individual interconnects 331 and a plurality of feed interconnects 332 are provided on the top surface 301 of the drive interconnection substrate 300.

As illustrated in FIGS. 2 and 3, the top surface 301 of the drive interconnection substrate 300 has a level region 312, and an inclined region 315. The inclined region 315 is positioned on the front side of the level region 312 and extends frontward to the front end 310 of the drive interconnection substrate 300. The level region 312 extends horizontally. The inclined region 315 extends horizontally in the left-right direction but slopes in the front-rear direction so as to approach the bottom surface 302 of the drive interconnection substrate 300 when progressing from the level region 312 to the front end 310.

The driver IC 120 and individual interconnects 331 are arranged within the level region 312 of the top surface 301 in a plan view. The feed interconnects 332 extend along the level region 312 and inclined region 315 in the front-rear direction.

<Individual Interconnects and Feed Interconnects>

The individual interconnects 331 (see FIG. 6) are provided with a one-on-one correspondence to the individual electrodes 42 on the channel forming substrate 20. Specifically, a plurality of individual interconnects 331 is juxtaposed in the front-rear direction along each of the left and right sides of the level region 312.

The feed interconnects 332 are wires that supply, from a flexible printed circuit board 125 (described later), power for the driver IC 120, ground (GNF) for the driver IC 120, drive signals (COM) for the individual electrodes 42, a bias voltage(ground) for the common electrode 43, control signals for the driver IC 120, and the like. The plurality of feed interconnects 332 is provided for the applications described above. In the following description, the feed interconnect 332 that applies a bias voltage (ground) to the common electrode 43 will be called the "bias feed interconnect 332a."

As illustrated in FIG. 2, the feed interconnects 332 extend to a position near the front end of the drive interconnection substrate 300. The front ends of the extended feed interconnects 332 are electrically connected to the flexible printed circuit board 125. While not explicitly illustrated in the drawings, the proximal end of the flexible printed circuit board 125 is connected to control elements of a control circuit and the like. As described above, the flexible printed circuit board 125 supplies signals and the like from the control elements to the feed interconnects 332.

The driver IC 120 is connected to the individual interconnects 331 and feed interconnects 332. Specifically, the driver IC 120 has a plurality of terminals 121, as illustrated in FIG. 6, for electrically connecting the driver IC 120 to the individual interconnects 331 and feed interconnects 332. Note that feed interconnects 332 other than the bias feed interconnect 332a are electrically connected to the driver IC 120 via the terminals 121. However, the bias feed interconnect 332a is not only electrically connected to the driver IC 120, but also to the common electrode 43 of the piezoelectric actuator 22.

<Through-Substrate Interconnects>

As illustrated in FIG. 6, a plurality of individual drive through-substrate interconnects 333 and at least one common drive through-substrate interconnect 334 are formed in the drive interconnection substrate 300. The individual drive through-substrate interconnects 333, on one hand, are provided with a one-on-one correspondence to the individual electrodes 42 in the channel forming substrate 20 and also a one-on-one correspondence to the individual interconnects 331. The common drive through-substrate interconnect 334, on the other hand, is provided to correspond to the common electrode 43 of the channel forming substrate 20 and also the bias feed interconnect 332a.

The individual drive through-substrate interconnects 333 and the common drive through-substrate interconnect 334 extend vertically through the drive interconnection substrate 300, spanning between the top surface 301 and bottom surface 302 of the drive interconnection substrate 300.

Specifically, through-holes are provided in the drive interconnection substrate 300, penetrating the drive interconnection substrate 300 in the thickness direction thereof (i.e., vertically). The individual drive through-substrate interconnects 333 are formed by filling these through-holes with a conductive material to form wiring that conducts electricity between the top surface 301 and bottom surface 302 of the drive interconnection substrate 300.

The individual drive through-substrate interconnects 333 are electrically connected to corresponding individual interconnects 331 on the top surface 301 of the drive interconnection substrate 300 and are electrically connected to the extension parts 3722 of corresponding individual drive bump conducting films 372a on the bottom surface 302 of the drive interconnection substrate 300.

As with the individual drive through-substrate interconnects 333, the common drive through-substrate interconnect 334 is formed by filling at least one through hole that vertically penetrates the drive interconnection substrate 300 with a conductive material. The common drive through-substrate interconnect 334 is electrically connected to the bias feed interconnect 332a at the top surface 301 of the drive interconnection substrate 300 and is electrically connected to the embedded interconnect 351 at the bottom surface 302 of the drive interconnection substrate 300. Both the individual drive through-substrate interconnects 333 and common drive through-substrate interconnect 334 may be formed of copper (Cu) or another metal through a process such as electrolytic plating or non-electrolytic plating.

<Bonding of Drive Interconnection Substrate and Channel Forming Substrate>

The drive interconnection substrate 300 and the channel forming substrate 20 having the structure described above are bonded together as follows.

First, an adhesive for forming the adhesive layer 381 is applied to the curved surfaces of the dummy bumps 380. Next, the drive interconnection substrate 300 on which the drive bumps 370, dummy bumps 380, and the like are disposed is arranged such that the bottom surface 302 of the drive interconnection substrate 300 confronts the top surface 201 of the channel forming substrate 20, with each individual drive bump conducting film 372a positioned above a corresponding individual drive terminal 45, each common drive bump conducting film 372b positioned above the connecting part 43b of the common electrode 43, and each dummy bump 380 positioned above the insulating layer 44. In this state, the drive interconnection substrate 300 and the channel forming substrate 20 are pressed toward each other so that the distal edges of the individual drive bump core parts 371a elastically deform to shapes conforming to the surface shapes of the individual drive terminals 45, and the distal edge of the common drive bump core part 371b elastically deforms to a shape conforming to the surface shape of the connecting part 43b. As a result, the individual drive bump conducting films 372a deform to follow the surface shapes of the individual drive terminals 45 and become electrically bonded to the same, and the common drive bump conducting films 372b deform to follow the surface shape of the connecting part 43b and become electrically bonded to the common electrode 43. However, since the vertical dimensions of the dummy bumps 380 are smaller than those of the drive bumps 370 and are smaller than the gap between the drive interconnection substrate 300 and channel forming substrate 20 defined by the spacers 140, the dummy bumps 380 do not directly contact the insulating layer 44 when the drive bumps 370 become bonded. On the other hand, the adhesive applied to the curved surfaces of the dummy bumps 380 fixes the dummy bumps 380 to the insulating layer 44, thereby forming the adhesive layer 381 between the curved surfaces of the dummy bumps 380 and the insulating layer 44.

By connecting the individual drive bump conducting films 372a to the individual drive terminals 45 as described above, the driver IC 120 becomes electrically connected to the individual electrodes 42 of the piezoelectric elements 41 through the individual interconnects 331, individual drive through-substrate interconnects 333, individual drive bump conducting films 372a, and individual drive terminals 45. Accordingly, drive signals can be supplied from the driver IC 120 to each piezoelectric element 41. Further, by connecting the common drive bump conducting films 372b to the connecting part 43b of the common electrode 43, a bias voltage can be supplied from the flexible printed circuit board 125 to the common electrode 43 of the piezoelectric actuator 22.

Further, the spacers 140 provided on both left and right sides of each of the individual drive bumps 370a and common drive bump 370b fix the relative positions of the channel forming substrate 20 and drive interconnection substrate 300 so that the top surface 201 of the channel forming substrate 20 and the bottom surface 302 of the drive interconnection substrate 300 confront each other with a prescribed gap formed therebetween. Thus, the spacers 140 form a retaining section 160 between the channel forming substrate 20 and drive interconnection substrate 300 as an internal space in which the piezoelectric actuator 22 is provided.

Further, forming the adhesive layer 381 in the gaps between the dummy bumps 380 and the insulating layer 44 of the channel forming substrate 20 not only fixes the positions of the dummy bumps 380 and the drive interconnection substrate 300 relative to the channel forming substrate 20, but also seals the gaps between the drive interconnection substrate 300 and channel forming substrate 20 while maintaining the retaining section 160 for accommodating the piezoelectric actuator 22. This configuration can isolate the retaining section 160 from the external atmosphere and suppress damage to the piezoelectric actuator 22 caused by humidity and the like. Further, since the dummy bumps 380 do not directly contact the channel forming substrate 20 according to this configuration, the gaps between the drive interconnection substrate 300 and channel forming substrate 20 can be reliably sealed without increasing the load applied to the channel forming substrate 20 during bonding. Hence, this arrangement suppresses bending, deformation, fracturing, or the like in the channel forming substrate 20 and can reliably prevent damage to the piezoelectric elements 41 and the like.

Further, by forming the dummy bumps 380 and the core parts 371 of the drive bumps 370 of a resin material having low hardness, damage and the like to the channel forming substrate 20 can be further suppressed. In addition, since the dummy bumps 380 have the same shape as the core parts 371 of the drive bumps 370, thereby avoiding an increase in manufacturing steps and suppressing an increase in manufacturing costs. The dummy bumps 380 can form an effective seal between the drive interconnection substrate 300 and the channel forming substrate 20 since the dummy bumps 380 extend along the entire periphery of the rectangular drive interconnection substrate 300.

While the description has been made in detail with reference to a specific embodiment, it would be apparent to those skilled in the art that various changes and modifications may be made thereto.

<First Variation>

Figure 7:
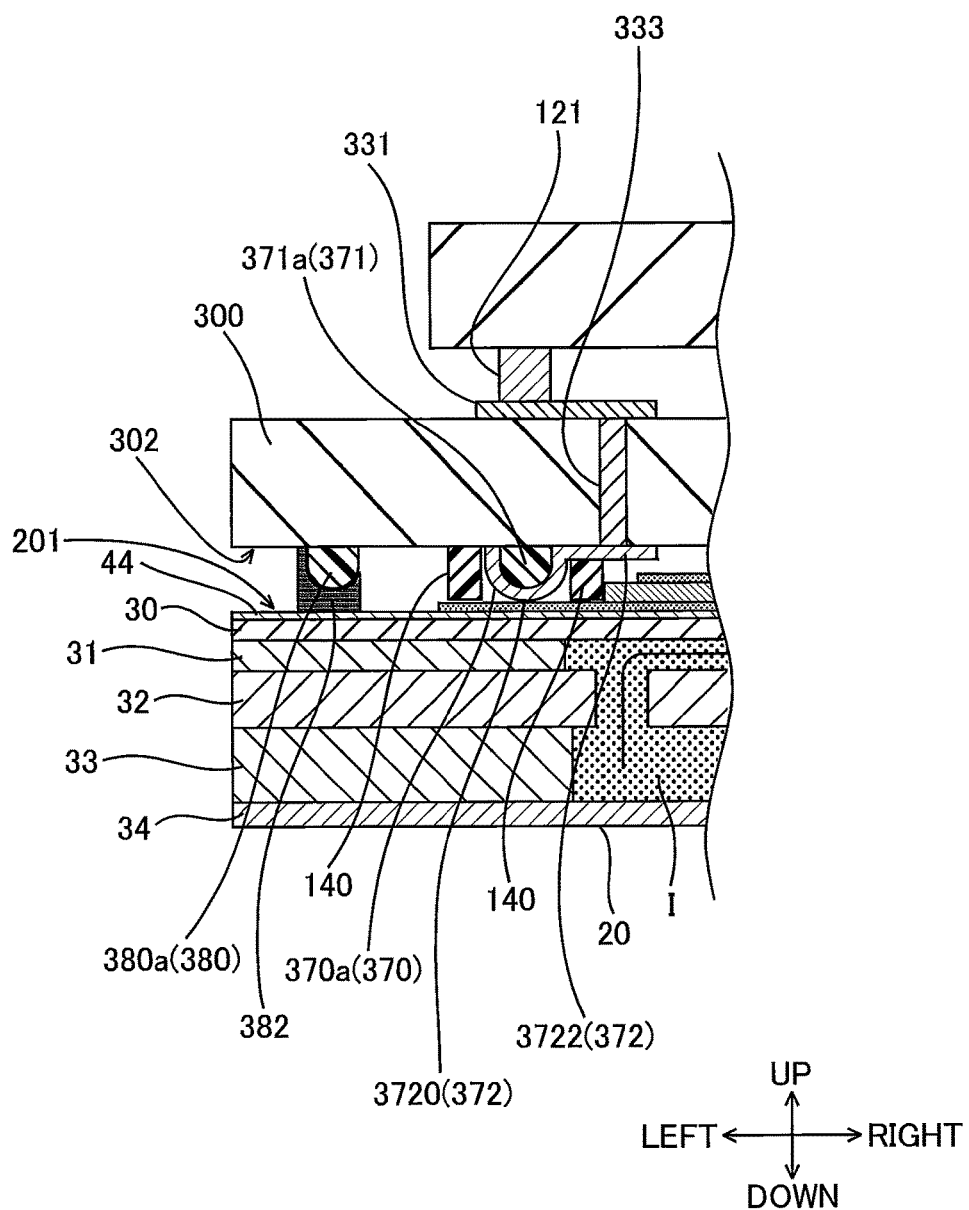
FIG. 7 is an enlarged view illustrating a left portion of an inkjet head according to a first variation of the embodiment.

FIG. 7 is an enlarged view illustrating the left portion of an inkjet head according to a first variation of the embodiment. In the first variation, a potting method is used to form an adhesive layer on the outer side surface of each dummy bump 380 (the left side surface of the left dummy bump 380a positioned near the left side 322 of the drive interconnection substrate 300) after the drive interconnection substrate 300 and channel forming substrate 20 have been bonded together. This process forms an adhesive layer 382 around the circumference of the dummy bumps 380 that fills the gaps between the dummy bumps 380 and the channel forming substrate 20 and covers the outer surfaces of the dummy bumps 380 arranged in a rectangular shape, as illustrated in FIG. 7. In other words, since the adhesive layer 382 seals the gaps between the dummy bumps 380 and the channel forming substrate 20 and seals the gaps between the drive interconnection substrate 300 and channel forming substrate 20 on the outside of the dummy bumps 380, this method can obtain a better sealing effect by improving the hermetical seal for the retaining section 160 in which the piezoelectric actuator 22 is disposed.

<Second Variation>

Figure 8:
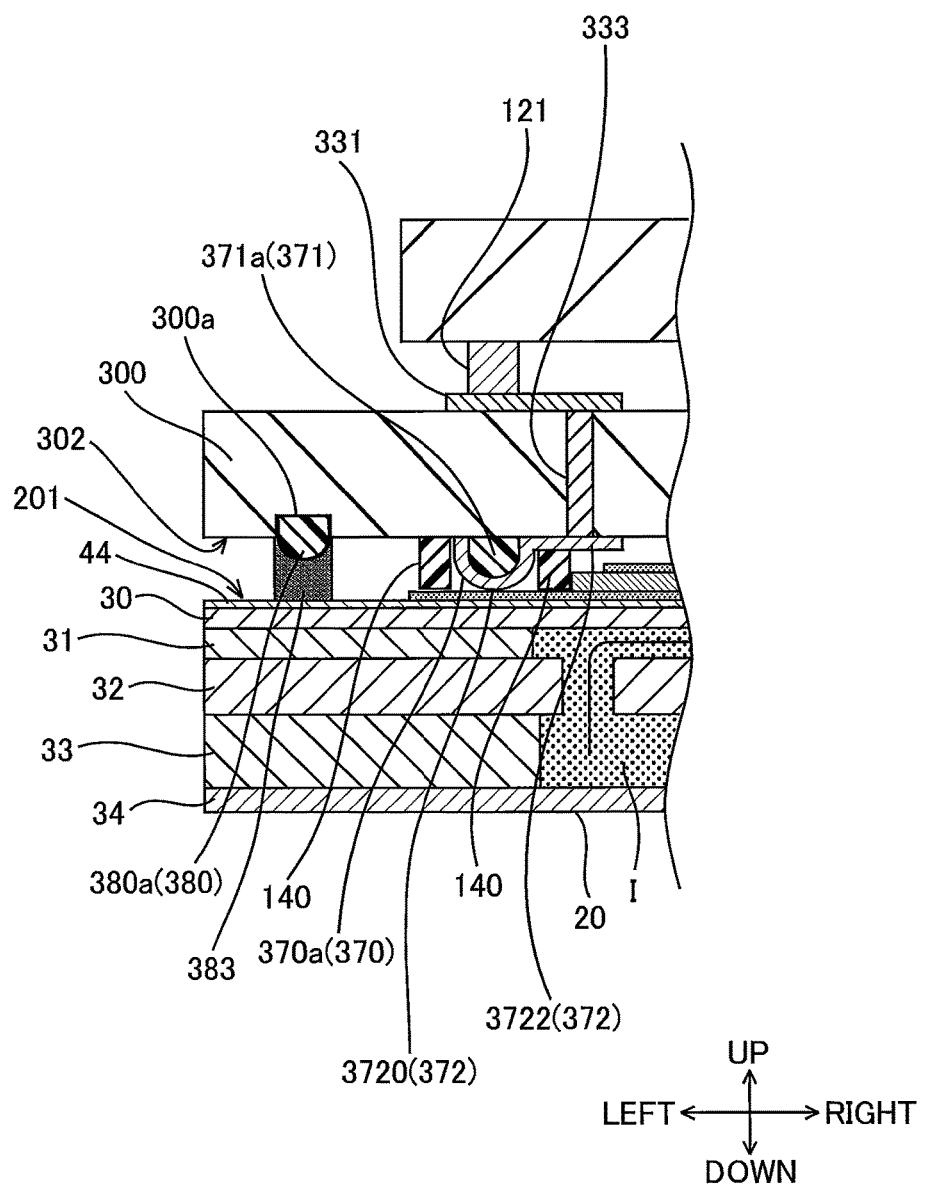
FIG. 8 is an enlarged view illustrating a left portion of an inkjet head according to a second variation of the embodiment.

FIG. 8 illustrates an inkjet head according to a second variation of the embodiment. In the second variation, a groove 300a is formed in the bottom surface 302 of the drive interconnection substrate 300, and the dummy bumps 380 are provided inside of the groove 300a and protrude out from the groove 300a toward the top surface 201 of the channel forming substrate 20. Specifically, the groove 300a is formed in the bottom surface 302 of the drive interconnection substrate 300 along the entire periphery of the drive interconnection substrate 300 formed in a rectangular shape. The groove 300a is shaped through an etching process, for example, to conform to the outer shape of the dummy bumps 380. The dummy bumps 380 are then disposed in the groove 300a so as to protrude out of the groove 300a toward the top surface 201 of the channel forming substrate 20. Since this configuration maintains a sufficient distance between the dummy bumps 380 and the channel forming substrate 20, the dummy bumps 380 are reliably prevented from contacting the top surface 201 of the channel forming substrate 20 when the drive interconnection substrate 300 and channel forming substrate 20 are bonded together, even when a large force is applied to press the drive interconnection substrate 300 and channel forming substrate 20 toward each other. Further, an adhesive layer 383 is formed between the dummy bumps 380 and the channel forming substrate 20, thereby further suppressing damage and the like to the channel forming substrate 20 without impairing the sealing effect.

<Third Variation>

Figure 9:
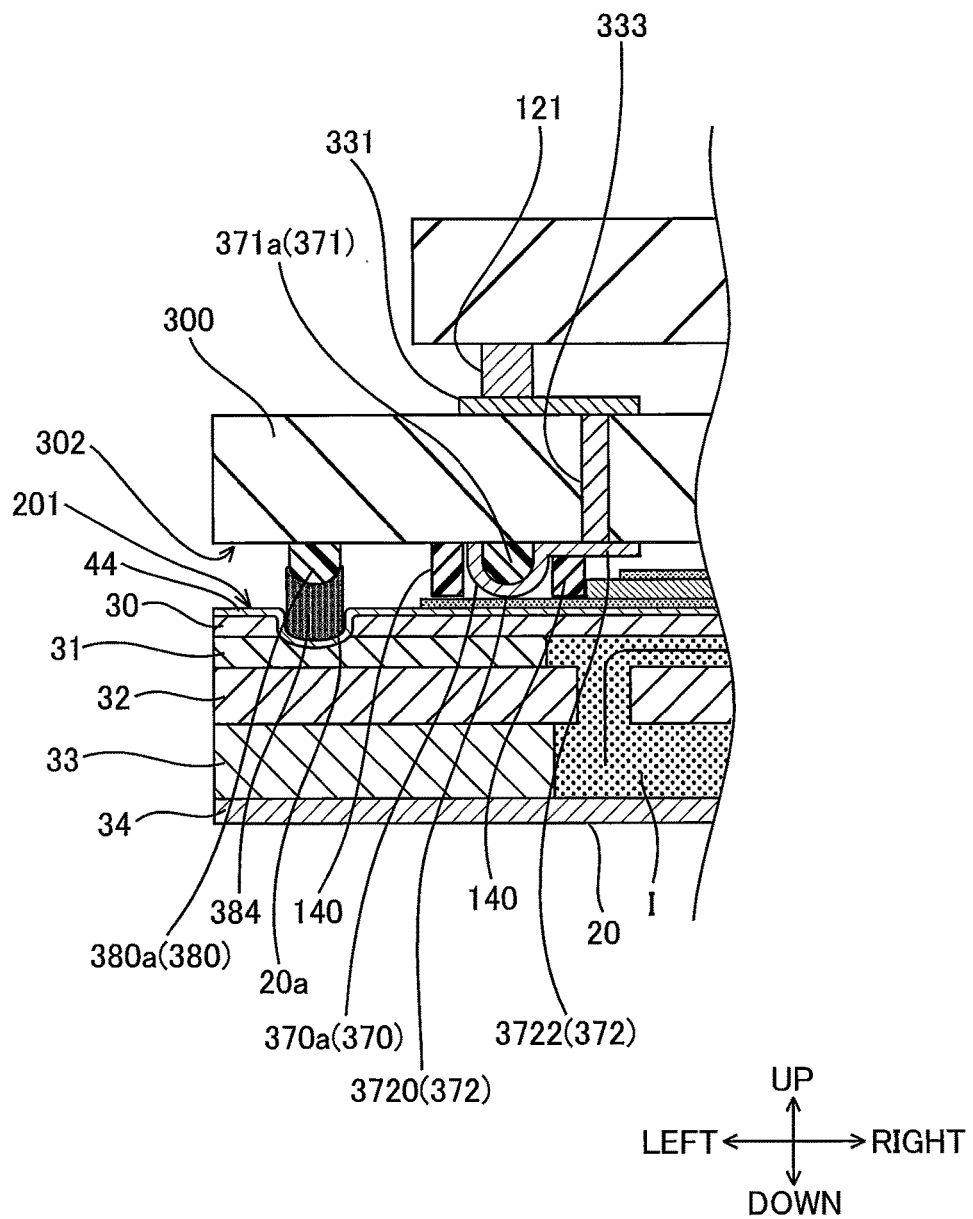
FIG. 9 is an enlarged view illustrating a left portion of an inkjet head according to a third variation of the embodiment.

FIG. 9 illustrates an inkjet head according to a third variation of the embodiment. In the third variation, a groove 20a is formed in the top surface 201 of the channel forming substrate 20 at positions corresponding to the dummy bumps 380. Specifically, the groove 20a is formed in the top surface 201 of the channel forming substrate 20 through an etching process or the like prior to covering the top surface 201 with the insulating layer 44. The groove 20a is formed to extend around the entire periphery of the channel forming substrate 20 formed in a rectangular shape. Subsequently, the entire top surface 201 of the channel forming substrate 20, including the groove 20a, is covered with the insulating layer 44. Next, the curved surfaces of the dummy bumps 380 are coated with an adhesive, and the drive interconnection substrate 300 and channel forming substrate 20 are bonded together, forming an adhesive layer 384 between the dummy bumps 380 and the channel forming substrate 20 that forms a seal inside the groove 20a. Since this configuration maintains a sufficient distance between the dummy bumps 380 and the channel forming substrate 20, the dummy bumps 380 are reliably prevented from contacting the top surface 201 of the channel forming substrate 20 even when a large force is applied for pressing the drive interconnection substrate 300 and channel forming substrate 20 together during bonding the drive interconnection substrate 300 to the channel forming substrate 20. Thus, damage and the like to the channel forming substrate 20 can be further suppressed. In addition, the groove 20a serves as a wall that can prevent adhesive from flowing into the internal space between the drive interconnection substrate 300 and channel forming substrate 20, thereby improving yield while avoiding a loss in the sealing effect.

<Fourth Variation>

Figure 10:
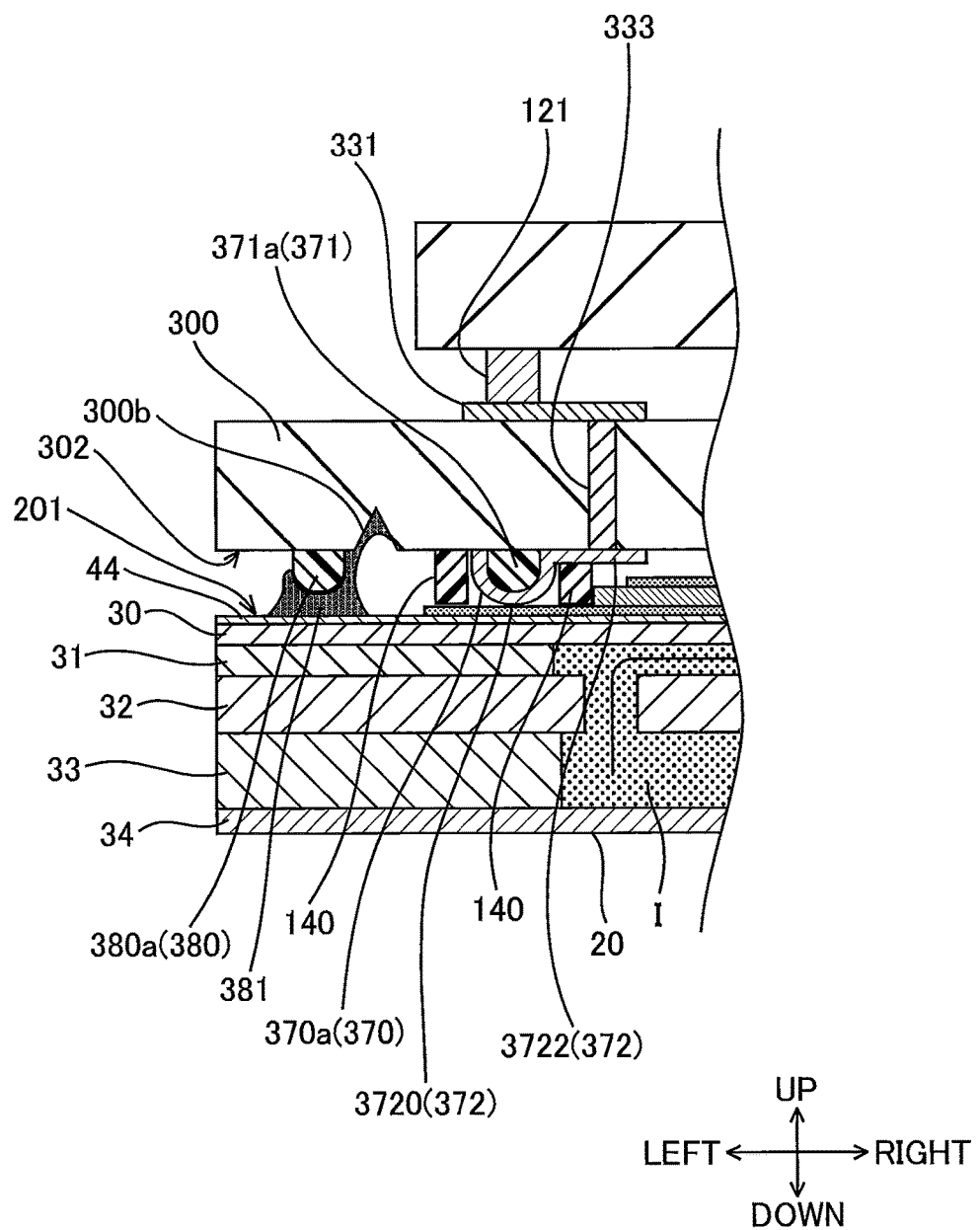
FIG. 10 is an enlarged view illustrating a left portion of an inkjet head according to a fourth variation of the embodiment.

FIG. 10 illustrates an inkjet head according to a fourth variation of the embodiment. In the fourth variation, a notch-like groove 300b is formed in the bottom surface 302 of the drive interconnection substrate 300 at a position inside of the dummy bumps 380 (the right side of the left dummy bump 380a illustrated in FIG. 10). With this configuration, even if the adhesive used to form the adhesive layer 381 flows inward into the space between the drive interconnection substrate 300 and channel forming substrate 20, the adhesive will flow into the groove 300b, thereby preventing the adhesive from flowing farther inward than the groove 300b. Since the groove 300b can prevent the adhesive from flowing farther inward than the groove 300b, this configuration can prevent damage to the piezoelectric actuator 22 and the like and improve yield, while avoiding a loss in the sealing effect.

<Fifth Variation>

Figure 11:
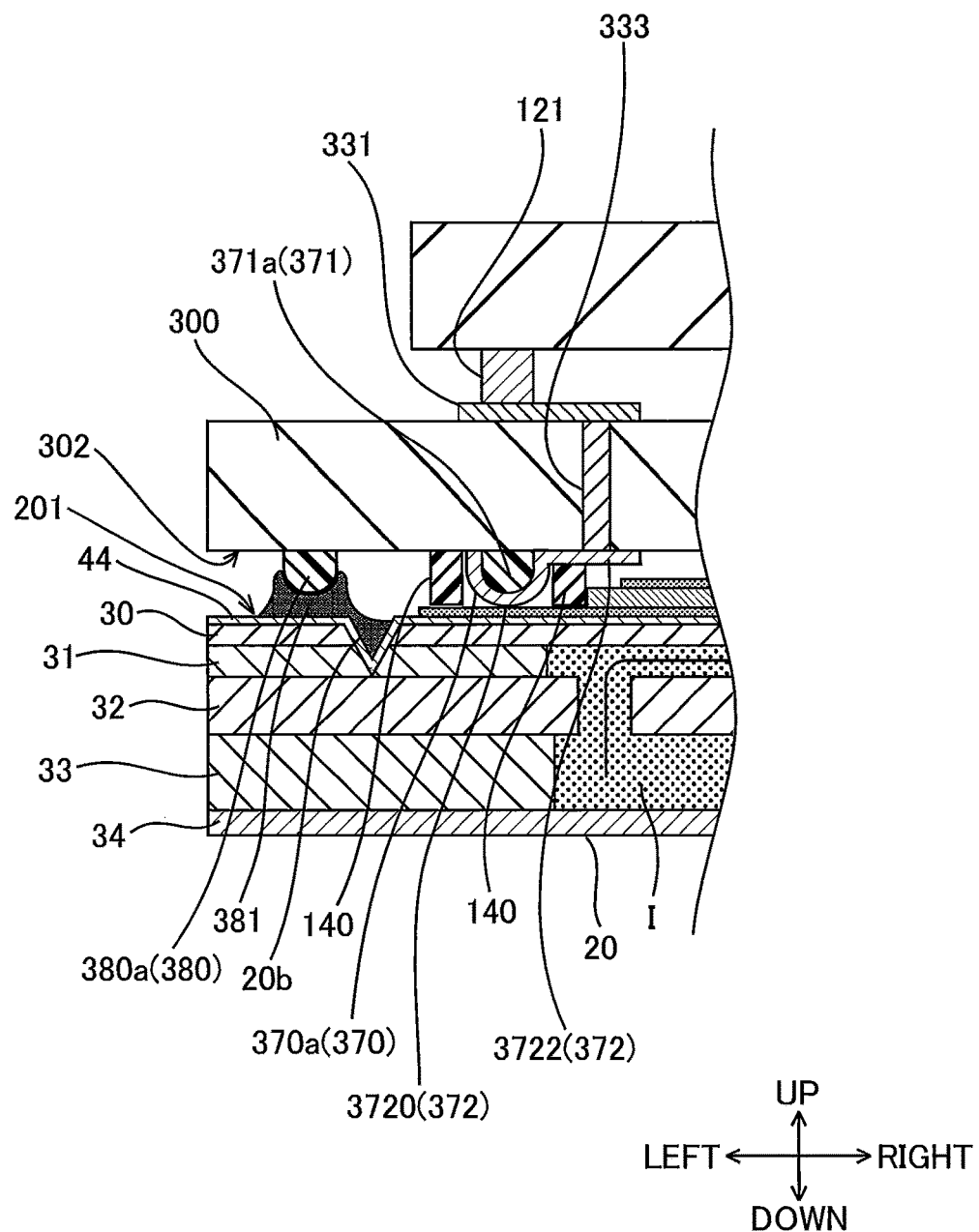
FIG. 11 is an enlarged view illustrating a left portion of an inkjet head according to a fifth variation of the embodiment.

FIG. 11 illustrates an inkjet head according to a fifth variation of the embodiment. In the fifth variation, a notch-like groove 20b is formed in the top surface 201 of the channel forming substrate 20 at a position inside of the dummy bumps 380 (the right side of the left dummy bump 380a illustrated in FIG. 11). Since the method for forming the groove 20b is identical to that used for forming the groove 20a in the third variation, a description of his process will not be repeated here. With this configuration, if adhesive used to form the adhesive layer 381 flows inward into the space between the drive interconnection substrate 300 and channel forming substrate 20, the adhesive will enter the groove 20b. Hence, the groove 20b can prevent the adhesive from flowing farther inward, achieving the same effects described in the fourth variation.

<Sixth Variation>

Figure 12:
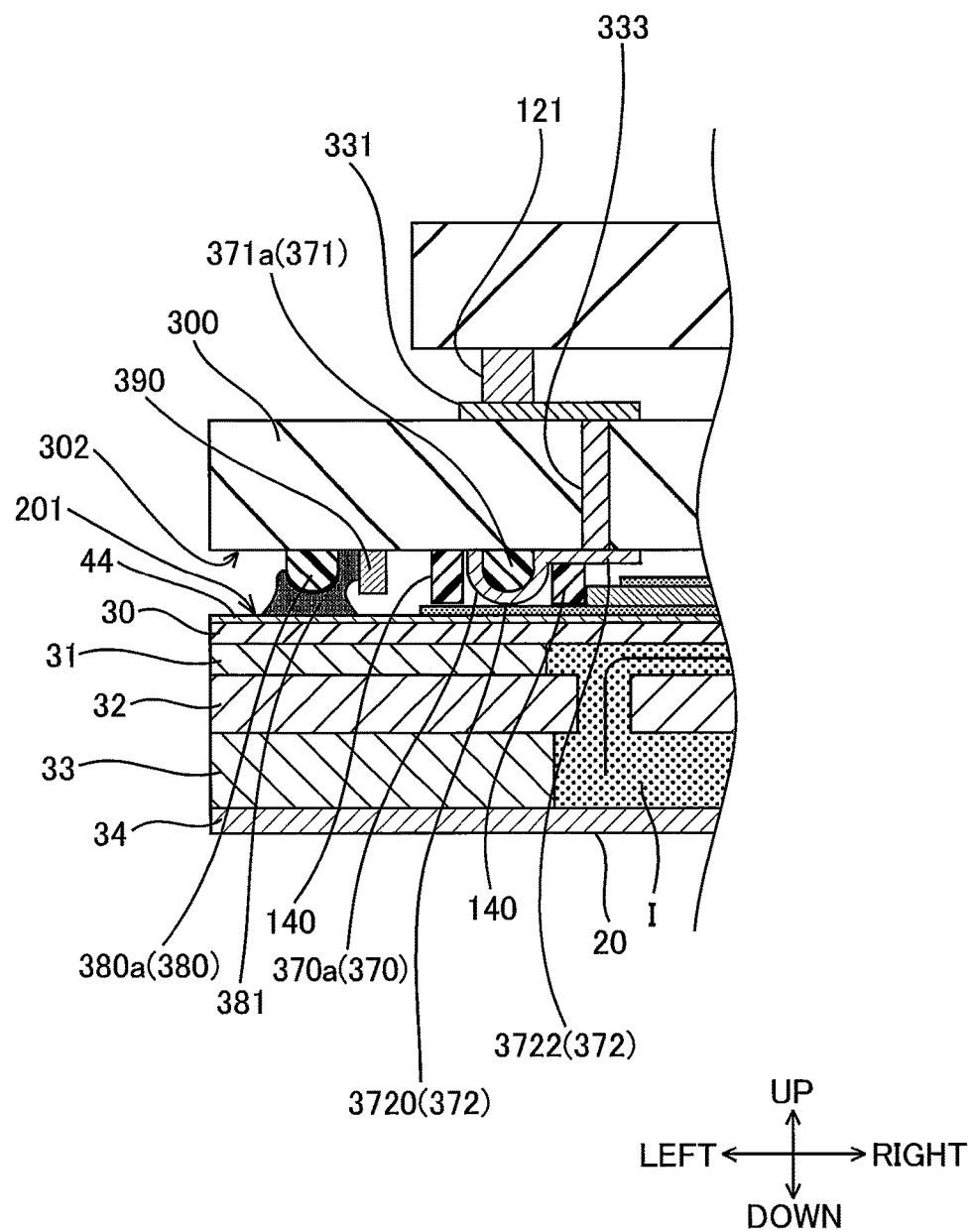
FIG. 12 is an enlarged view illustrating a left portion of an inkjet head according to a sixth variation of the embodiment.

FIG. 12 illustrates an inkjet head according to a sixth variation of the embodiment. In the sixth variation, a wall section 390 is formed on the bottom surface 302 of the drive interconnection substrate 300 at a position inside of the dummy bumps 380 (to the right of the left dummy bump 380a in the example illustrated in FIG. 12). The wall section 390 protrudes toward the top surface 201 of the channel forming substrate 20. With this configuration, even if adhesive used to form the adhesive layer 381 flows inward into the internal space between the drive interconnection substrate 300 and channel forming substrate 20, the wall section 390 can contain the flow of adhesive to prevent the adhesive from flowing farther inward, thereby obtaining the same effects described in the fourth and fifth variations.

<Seventh Variation>

Figure 13:
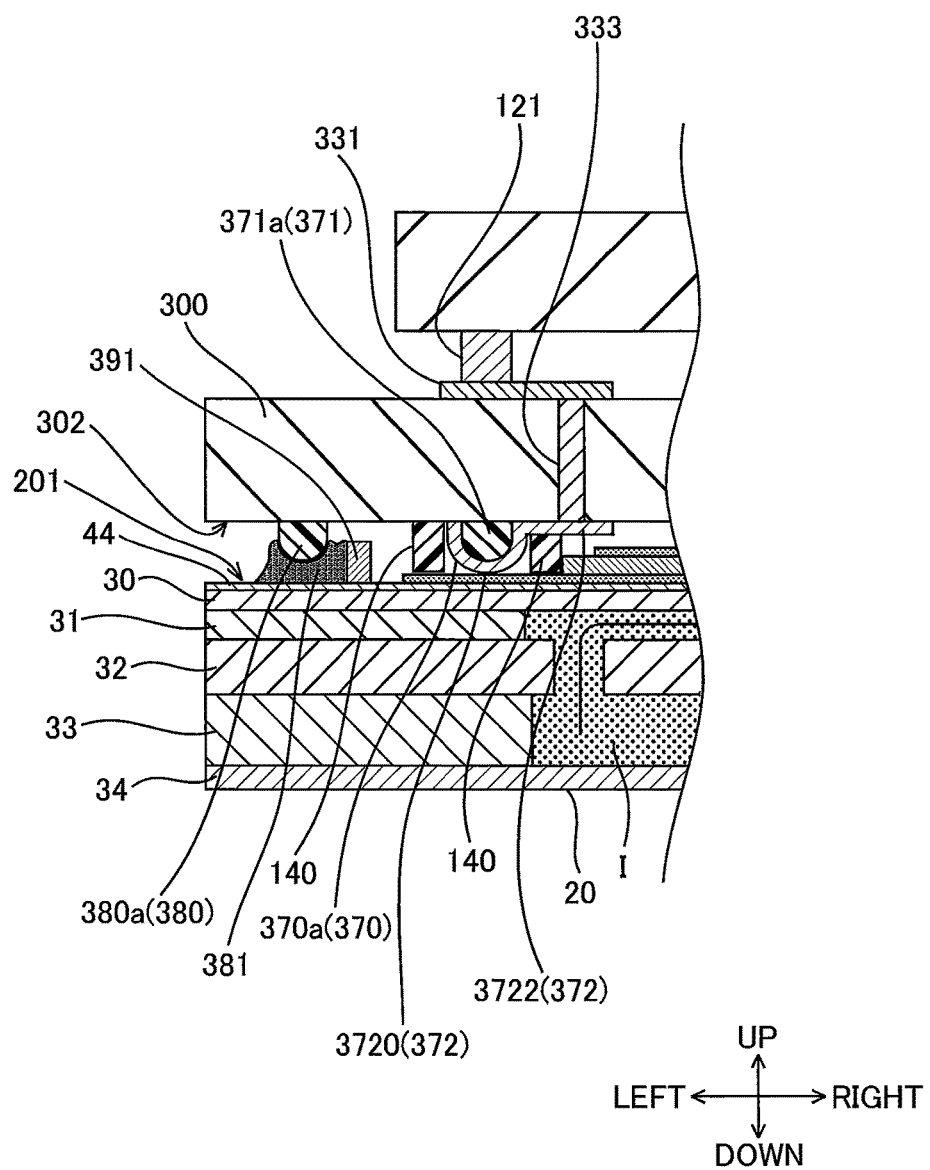
FIG. 13 is an enlarged view illustrating a left portion of an inkjet head according to a seventh variation of the embodiment.

FIG. 13 illustrates an inkjet head according to a seventh variation of the embodiment. In the seventh variation, a wall section 391 is formed on the top surface 201 of the channel forming substrate 20 at a position inside of the dummy bumps 380 (to the right of the left dummy bump 380a illustrated in FIG. 13). The wall section 391 protrudes toward the bottom surface 302 of the drive interconnection substrate 300. With this configuration, even if adhesive used to form the adhesive layer 381 flows inward into the space between the drive interconnection substrate 300 and the channel forming substrate 20, the wall section 391 can contain the flow of adhesive and prevent the adhesive from flowing farther inward, thereby obtaining the same effects described in the fourth, fifth, and sixth variations.

While the embodiment and its variations described above apply the liquid ejecting device of the present disclosure to an inkjet head, the composite substrate of the disclosure is not limited to devices used in applications that apply pressure to a liquid. The present disclosure may be used in other applications, such as displacing or generating vibrations in a plurality of solid driving objects by arranging a plurality of piezoelectric elements on a substrate and driving the piezoelectric elements with a driver IC or the like to deform the substrate.

What is claimed is:

1. A composite substrate comprising:
  a first substrate having a first surface, the first substrate having a thickness defining a thickness direction;
  a second substrate having a second surface facing the first surface with a predetermined gap therebetween in the thickness direction;
  an electric contact positioned at the second surface;
  a first bump having a first length in the thickness direction, the first bump comprising:
    a core provided at the first surface and having a convex shape protruding in the thickness direction; and
    a conducting film covering a part of the core and in contact with the electric contact; and
  a second bump provided at the first surface and having a convex shape protruding in the thickness direction, the second bump having a second length in the thickness direction, the second length being smaller than the first length.

2. The composite substrate according to claim 1, wherein the second bump is a dummy bump electrically insulated from the electric contact.

3. The composite substrate according to claim 1, wherein the second length of the second bump in the thickness direction is smaller than the predetermined gap.

4. The composite substrate according to claim 1, wherein the core of the first bump has a shape the same as that of the second bump.

5. The composite substrate according to claim 1, wherein the core of the first bump and the second bump are made from resin.

6. The composite substrate according to claim 1, wherein the first surface is formed with a groove, and
  wherein the second bump is provided at the groove.

7. The composite substrate according to claim 6, wherein the groove is formed by etching.

8. The composite substrate according to claim 1, wherein the second surface is formed with a groove at a position in confrontation with the second bump.

9. The composite substrate according to claim 8, wherein the groove is formed by etching.

10. The composite substrate according to claim 1, further comprising an actuator element provided at the second surface and connected to the electric contact,
  wherein the first surface has an end in a first direction perpendicular to the thickness direction, and
  wherein the second bump is positioned closer to the end of the first surface than either the first bump and the actuator element is to the end of the first surface in the first direction.

11. The composite substrate according to claim 10, further comprising an insulating layer positioned between the second bump and the second surface.

12. The composite substrate according to claim 11, wherein the second bump has an end portion close to the end of the first surface, and
wherein the insulating layer covers the end portion of the second bump.

13. The composite substrate according to claim 11, wherein the insulating layer is an adhesive agent layer formed by potting.

14. The composite substrate according to claim 10, further comprising a wall provided at the first surface and protruding in the thickness direction, the wall being positioned between the second bump and a position in confrontation with the actuator element.

15. The composite substrate according to claim 10, further comprising a wall provided at the second surface and protruding in the thickness direction, the wall being positioned between the actuator element and a position in confrontation with the second bump.

16. The composite substrate according to claim 10, wherein the first surface is formed with a groove at a position between the second bump and a position in confrontation with the actuator element.

17. The composite substrate according to claim 10, wherein the second surface is formed with a groove at a position between the actuator element and a position in confrontation with the second bump.

18. The composite substrate according to claim 10, wherein the first bump is provided with a plurality of connection bumps arrayed with each other in a second direction perpendicular to the thickness direction and the first direction,
wherein each of the plurality of connection bumps comprises the core and the conducting film, and
wherein the second bump has an elongated shape extending in the second direction, and is positioned closer to the end of the first surface than the first bump is to the end of the first surface in the first direction.

19. The composite substrate according to claim 1, wherein the second bump has a protruding end in the thickness direction, the protruding end being separated from the second surface.

20. The composite substrate according to claim 19, further comprising an adhesive agent layer positioned between the second bump and the second surface.

* * * * *